(12) United States Patent
Tsai

(10) Patent No.: US 8,018,365 B1
(45) Date of Patent: Sep. 13, 2011

(54) CONTINUOUS-TIME DELTA-SIGMA ADC WITH COMPACT STRUCTURE

(75) Inventor: Jen-Che Tsai, Taichung County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/723,680

(22) Filed: Mar. 14, 2010

(51) Int. Cl.
*H03M 3/00* (2006.01)

(52) U.S. Cl. ........................ 341/143; 341/172

(58) Field of Classification Search ........... 341/143–173
See application file for complete search history.

(56) References Cited

U.S. PATENT DOCUMENTS

| | | | |
|---|---|---|---|
| 6,232,897 B1 * | 5/2001 | Knusen | 341/162 |
| 6,445,318 B1 * | 9/2002 | Ruha et al. | 341/143 |
| 6,462,687 B1 * | 10/2002 | Eshraghi et al. | 341/143 |
| 6,744,392 B2 * | 6/2004 | Melanson | 341/143 |
| 7,158,062 B2 * | 1/2007 | Cosand | 341/143 |
| 7,324,028 B2 * | 1/2008 | Hsieh et al. | 341/143 |
| 7,561,089 B2 * | 7/2009 | Zare-Hoseini et al. | 341/150 |
| 7,663,525 B2 * | 2/2010 | Tsai | 341/172 |
| 2005/0116850 A1 * | 6/2005 | Hezar et al. | 341/143 |

OTHER PUBLICATIONS

Arias, "A 32-mW 320-MHz Continuous-Time Complex Delta-Sigma ADC for Multi-Mode Wireless-LAN Receivers", IEEE Journal of Solid-State Circuits, vol. 41, No. 2, pp. 339-351, Feb. 2006.

* cited by examiner

*Primary Examiner* — Lam T Mai
(74) *Attorney, Agent, or Firm* — Winston Hsu; Scott Margo

(57) ABSTRACT

A continuous-time delta-sigma Analog to Digital Converter (ADC) with a compact structure comprises a loop filter, a summing circuit, a quantizer, and a current Digital to Analog Converter (DAC). The loop filter is utilized for receiving and noise-shaping an analog input signal, and accordingly outputting a positive and a negative loop voltages. The summing circuit comprises a positive and a negative summing resistors. The summing resistors are utilized for transforming a positive and negative feedback currents to be a positive and a negative feedback voltages, and summing the loop voltages and the feedback voltages so as to generate a positive and a negative summing voltages, respectively. The quantizer is utilized for outputting a digital output signal according to a difference between the positive and the negative summing voltages. The current DAC is utilized for generating the positive and the negative feedback currents according to the digital output signal.

21 Claims, 8 Drawing Sheets

CONTINUOUS-TIME DELTA-SIGMA ADC WITH COMPACT STRUCTURE

BACKGROUND OF THE INVENTION

1. Field of the Invention

The present invention relates to a continuous-time delta-sigma Analog to Digital Converter (ADC), and more particularly, to a continuous-time delta-sigma ADC with a compact structure.

2. Description of the Prior Art

The delta-sigma ADC, also referred as the $\Delta/\Sigma$ ADC, has a major advantage of shaping the quantization noise spectrum for efficiently removing the noise from the output. More specifically, the delta-sigma ADC can move the noise from low frequencies into high frequencies so that the noise of the output can be filtered out by a low-pass filter. Since the continuous-time delta-sigma ADC is able to operate at a higher sampling frequency than the discrete-time delta-sigma ADC, the continuous-time delta-sigma ADC is more applicable in wireless communication receivers.

Please refer to FIG. 1. FIG. 1 is a diagram illustrating a conventional continuous-time delta-sigma ADC 100. The continuous-time delta-sigma ADC 100 comprises a loop filter 110, a summing circuit 120, a quantizer 130, and a current Digital to Analog Converter (DAC) 140. The loop filter 110 noise-shapes an analog input signal $S_{AIN}$, and then accordingly outputs a positive loop voltage $V_{L+}$ and a negative loop voltage $V_{L-}$. The summing circuit 120 comprises a positive input resistor $R_{I+}$, a negative input resistor $R_{I-}$, a positive feedback resistor $R_{F+}$, a negative feedback resistor $R_{F-}$, and a fully differential amplifier 121. The resistors $R_{I+}$, $R_{I-}$, $R_{F+}$, and $R_{F-}$ all have the same resistance R. The summing circuit 120 generates a positive summing voltage $V_{S+}$ and a negative summing voltage $V_{S-}$ according to a positive feedback current $I_{FB+}$, a negative feedback current $I_{FB-}$, and the loop voltages $V_{L+}$ and $V_{L-}$. The quantizer 130 outputs a digital output signal $S_{DOUT}$ according the difference between the summing voltages $V_{S+}$ and $V_{S-}$. The current DAC 140 drains/sources the positive feedback current $I_{FB+}$ from/to the summing circuit 120, and sources/drains the negative feedback current $I_{FB-}$ to/from the summing circuit 120 according to the value of the digital output signal $S_{DOUT}$. For example, when the value of the digital output signal $S_{DOUT}$ is larger than zero, the current DAC 140 sources the positive feedback current $I_{FB+}$ to the summing circuit 120 and drains the negative feedback current $I_{FB-}$ from the summing circuit 120; when the value of the digital output signal $S_{DOUT}$ is smaller than zero, the current DAC converter 140 drains the positive feedback current $I_{FB+}$ from the summing circuit 120 and sources the negative feedback current $I_{FB-}$ to the summing circuit 120. The magnitudes of the feedback currents $I_{FB+}$ and $I_{FB-}$ are both ($N_{DOUT} \times I_{DAC}$), wherein $I_{DAC}$ is the magnitude of the Least Significant Bit (LSB) current of the current DAC 140, and $N_{DOUT}$ is a value represented by the digital output signal $S_{DOUT}$. For example, when the value $N_{DOUT}$ represented by the digital output signal $S_{DOUT}$ is (+3), the current DAC 140 drains the positive feedback current $I_{FB+}$ from the summing circuit 120 and sources the negative feedback current $I_{FB-}$ to the summing circuit 120 with the magnitude $3 \times I_{DAC}$; when the value $N_{DOUT}$ represented by the digital output signal $S_{DOUT}$ is (-2), the current DAC 140 sources the positive feedback current $I_{FB+}$ to the summing circuit 120 and drains the negative feedback current $I_{FB-}$ from the summing circuit 120 with the magnitude $2 \times I_{DAC}$. The difference between the summing voltages $V_{S+}$ and $V_{S-}$ can be represented by the following formula:

$$(V_{S+} - V_{S-}) = (V_{L+} - V_{L-}) - 2 \times N_{DOUT} \times I_{DAC} \times R \qquad (1).$$

Since the structure of the conventional continuous-time delta-sigma ADC is complicated, the layout area is wasted and the loop delay is increased, causing a higher cost and worse system stability.

SUMMARY OF THE INVENTION

The present invention provides a continuous-time delta-sigma Analog to Digital Converter (ADC) with a compact structure. The continuous-time delta-sigma ADC comprises a loop filter, a summing circuit, a quantizer, and a current Digital to Analog Converter (DAC). The loop filter is utilized for receiving and noise-shaping an analog input signal, and accordingly outputting a positive loop voltage and a negative loop voltage. The summing circuit comprises a positive summing resistor, and a negative summing resistor. The positive summing resistor is utilized for transforming a positive feedback current to be a positive feedback voltage, and summing the positive loop voltage and the positive feedback voltage so as to generate a positive summing voltage. The negative summing resistor is utilized for transforming a negative feedback current to be a negative feedback voltage, and summing the negative loop voltage and the negative feedback voltage so as to generate a negative summing voltage. The quantizer is utilized for outputting a digital output signal according to a difference between the positive summing voltage and the negative summing voltage. The current DAC is utilized for generating the positive and the negative feedback currents according to the digital output signal.

The present invention further provides a continuous-time delta-sigma ADC with a compact structure. The continuous-time delta-sigma ADC comprises a loop filter, a quantizer, and a current DAC. The loop filter comprises a delta-sigma modulator, and an output stage. The delta-sigma modulator is utilized for receiving and noise-shaping an analog input signal and accordingly generating a positive and a negative analog signals. The output stage is utilized for outputting a positive and a negative loop voltages. The output stage comprises a positive output transistor, and a negative output transistor. The positive output transistor comprises a control end, a first end, and a second end. The control end of the positive output transistor is utilized for receiving the positive analog signal. The first end of the positive output transistor is utilized for receiving a first reference current. The positive output transistor outputs the positive loop voltage at the first end of the positive output transistor according to the positive analog signal and the first reference current. The negative output transistor comprises a control end, a first end, and a second end. The control end of the negative output transistor is utilized for receiving the negative analog signal. The first end of negative output transistor is utilized for receiving the first reference current. The negative output transistor outputs the negative loop voltage at the first end of the negative output transistor according to the negative analog signal and the first reference current. The quantizer is utilized for outputting a digital output signal according to the difference between the positive loop voltage and the negative loop voltage. The quantizer comprises a first reference current module, a positive voltage divider, a negative voltage divider, and a comparing module. The first reference current module is utilized for providing the first reference current. The positive voltage divider is coupled between the first end of the positive output transistor and the first reference current module. The positive voltage divider is utilized for receiving the first reference current. The positive voltage divider comprises ($N_1-1$) positive voltage dividing resistors for generating $N_1$ positive comparing voltages. An $A^{th}$ positive comparing voltage can be represented by a following formula:

$$V_{CA+} = V_{C1+} + I_{REF} \times (A-1) \times R_Q;$$

the negative voltage divider is coupled between the first end of the negative output transistor and the first reference current module. The negative voltage divider is utilized for receiving the first reference current. The negative voltage divider comprises $(N_1-1)$ negative voltage dividing resistors for generating $N_1$ negative comparing voltages according to the first reference current. A $B^{th}$ negative comparing voltage can be represented by a following formula:

$$V_{CB-} = V_{C1-} + I_{REF} \times (B-1) \times R_Q;$$

wherein $N_1$, A, and B represents positive integers, $1 \leq A \leq N_1$, $1 \leq B \leq N_1$, $V_{CA+}$ represents the $A^{th}$ positive comparing voltage, $V_{CB-}$ represents the $B^{th}$ negative comparing voltage, $V_{C1+}$ represents a first positive comparing voltage, $V_{C1-}$ represents a first negative comparing voltage, $I_{REF}$ represents magnitude of the first reference current, and $R_Q$ represents resistance of one of the $(N_1-1)$ positive or the $(N_1-1)$ negative voltage dividing resistors. Resistance of the $(N_1-1)$ positive voltage dividing resistors and the $(N_1-1)$ negative voltage dividing resistors are same. The comparing module comprises $(N_1-1)$ comparators for generating $(N_1-1)$ compared result signals. An $M^{th}$ comparator of the $(N_1-1)$ comparators compares an $M^{th}$ positive comparing voltage of the $(N_1-1)$ positive comparing voltages and an $(N_1-M)^{th}$ negative comparing voltage of the $(N_1-1)$ negative comparing voltages for generating an $M^{th}$ compared result signal and $1 \leq M \leq (N_1-1)$. The digital output signal is obtained by combining the $(N_1-1)$ compared result signals. The current DAC is coupled to the positive voltage divider, the negative voltage divider, and the first reference current module. The current DAC is utilized for generating the positive and the negative feedback currents according to the digital output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
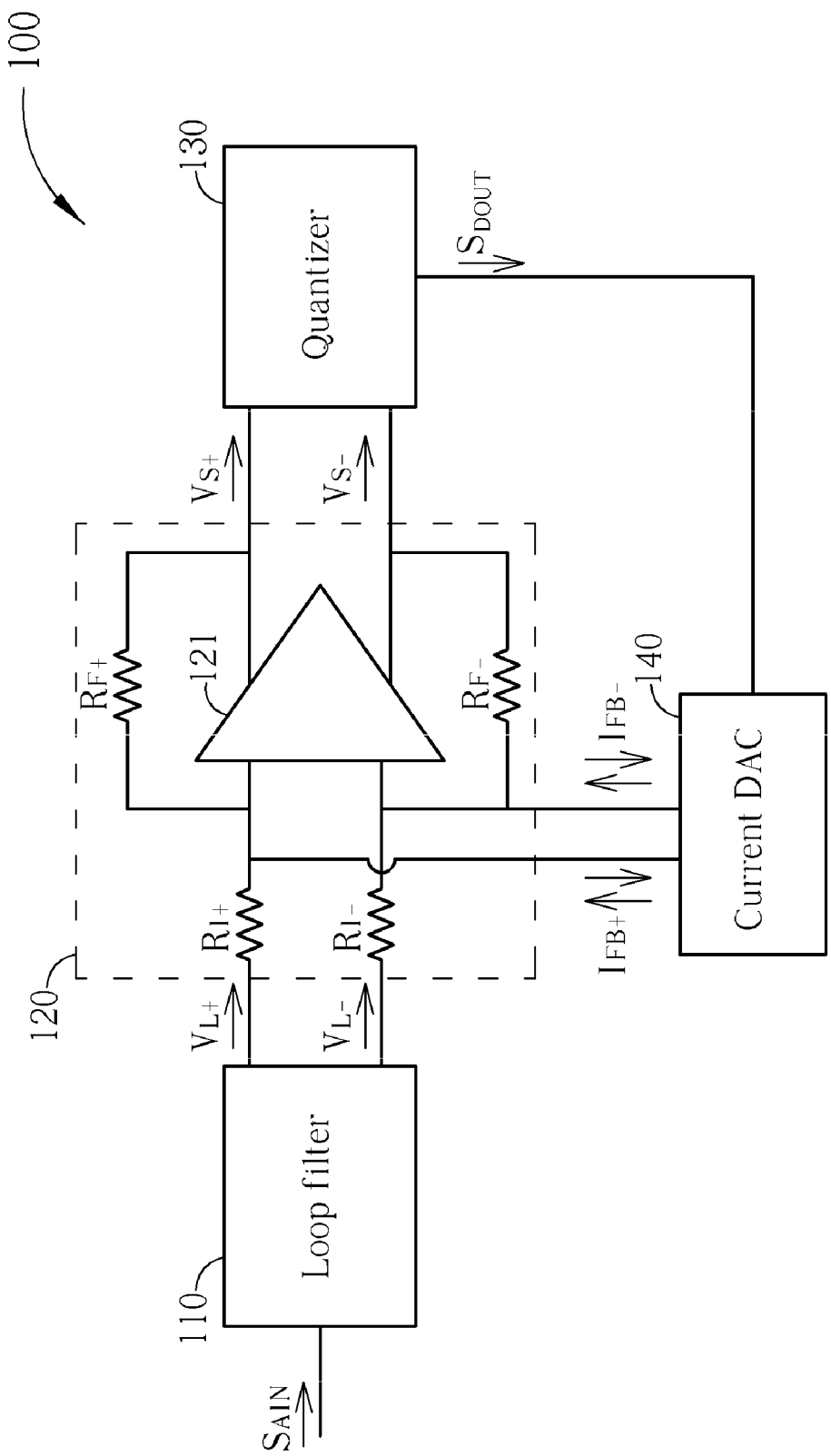
FIG. 1 is a diagram illustrating a conventional continuous-time delta-sigma ADC.
Figure 2:
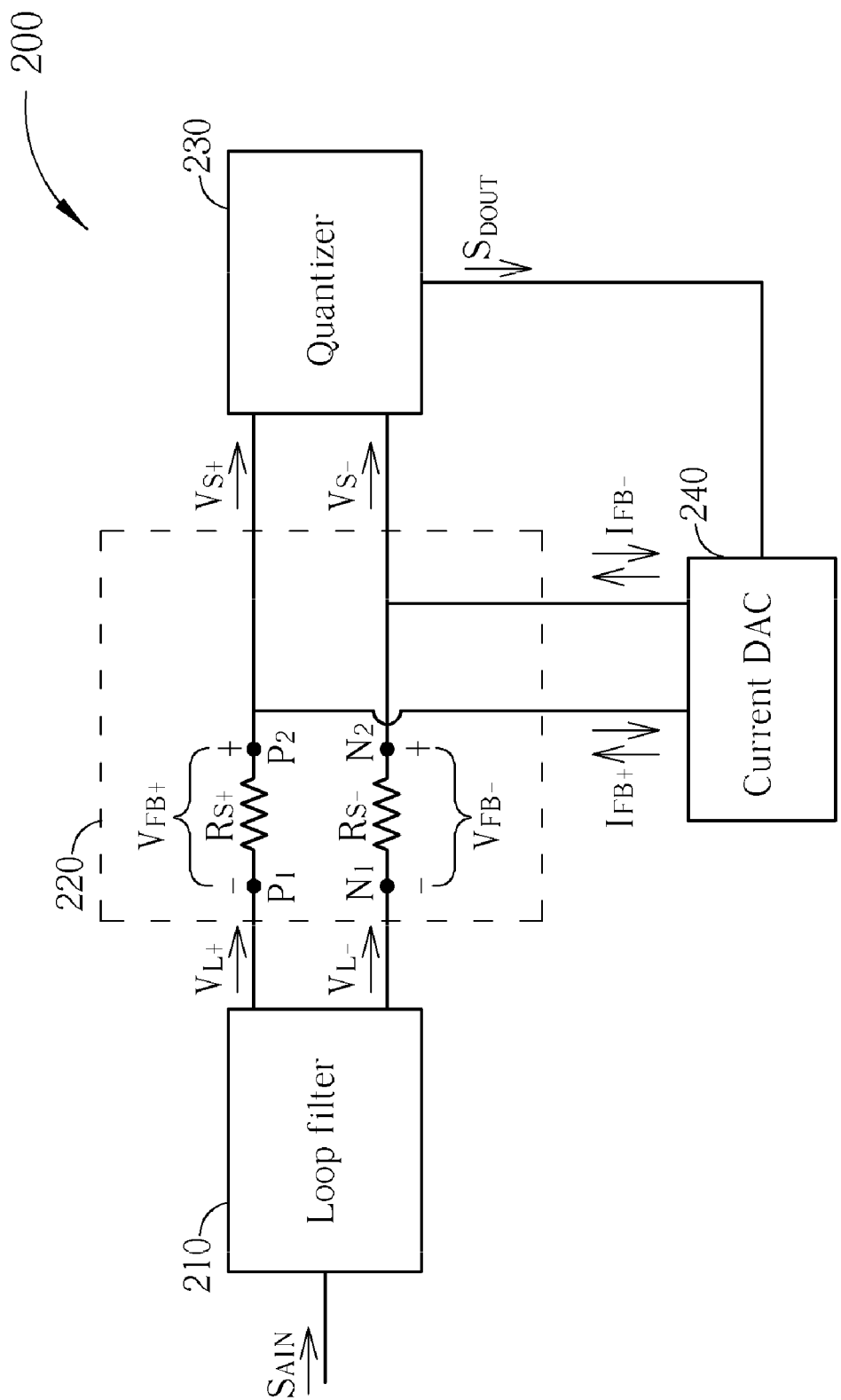
FIG. 2 is a diagram illustrating a continuous-time delta-sigma ADC having a compact structure according to a first embodiment of the present invention.

Please refer to FIG. 2. FIG. 2 is a diagram illustrating a continuous-time delta-sigma ADC 200 having a compact structure according to a first embodiment of the present invention. The continuous-time delta-sigma ADC 200 comprises a loop filter 210, a summing circuit 220, a quantizer 230, and a current DAC 240. The structures and the functions of the loop filter 210, the quantizer 230, and the current DAC 240 are similar to those of the loop filter 110, the quantizer 130, and the current DAC 140 and will not be repeated again for brevity.

The summing circuit 220 comprises a positive summing resistor $R_{S+}$ and a negative summing resistor $R_{S-}$. The summing resistors $R_{S+}$ and $R_{S-}$ have the same resistance R. The summing resistors $R_{S+}$ and $R_{S-}$ transform the feedback currents $I_{FB+}$ and $I_{FB-}$ to the feedback voltages $V_{FB+}$ and $V_{FB-}$, respectively, and sum the loop voltages $V_{L+}$ and $V_{L-}$ to the feedback voltages $V_{FB+}$ and $V_{FB-}$, respectively, so as to generate the summing voltages $V_{S+}$ and $V_{S-}$. The details are explained as follows.

The positive feedback voltage $V_{FB+}$, which is the voltage drop cross the positive summing resistor $R_{S+}$, is generated by the positive feedback current $I_{FB+}$ passing through the positive summing resistor $R_{S+}$. The direction of the positive feedback current $I_{FB+}$ is determined by the value of the digital output signal $S_{DOUT}$. For example, when the value $N_{DOUT}$ represented by the digital output signal $S_{DOUT}$ is larger than zero, the current DAC 240 sources the positive feedback current $I_{FB+}$ to the summing circuit 220, which means the positive feedback current $I_{FB+}$ passes from the nodes $P_2$ to $P_1$; when the value $N_{DOUT}$ represented by the digital output signal $S_{DOUT}$ is smaller than zero, the current DAC 240 drains the positive feedback current $I_{FB+}$ to the summing circuit 220, which means the positive feedback current $I_{FB+}$ passes from the nodes $P_1$ to $P_2$. The magnitude of the positive feedback current $I_{FB+}$ is $(N_{DOUT} \times I_{DAC})$, wherein $I_{DAC}$ is the magnitude of the LSB current of the current DAC 240. In this way, the voltage level of the positive feedback voltage $V_{FB+}$ is $(-N_{DOUT} \times I_{DAC} \times R_{S+})$. The positive summing voltage $V_{S+}$ is obtained by summing the positive feedback voltage $V_{FB+}$ and the positive loop voltage $V_{L+}$.

The negative feedback voltage $V_{FB-}$, which is the voltage drop cross the negative summing resistor $R_{S-}$, is generated by the negative feedback current $I_{FB-}$ passing through the negative summing resistor $R_{S-}$. The direction of the negative feedback current $I_{FB-}$ is determined by the value of the digital output signal $S_{DOUT}$. For example, when the value $N_{DOUT}$ is larger than zero, the current DAC 240 drains the negative feedback current $I_{FB-}$ to the summing circuit 220, which means the negative feedback current $I_{FB-}$ passes from the nodes $N_1$ to $N_2$; when the value $N_{DOUT}$ is smaller than zero, the current DAC 240 sources the negative feedback current $I_{FB-}$ to the summing circuit 220, which means the negative feedback current $I_{FB-}$ passes from the nodes $N_2$ to $N_1$. The magnitude of the negative feedback current $I_{FB-}$ is $(N_{DOUT} \times I_{DAC})$, wherein $I_{DAC}$ is the magnitude of the LSB current of the current DAC 240. In this way, the voltage level of the negative feedback voltage $V_{FB-}$ is $(N_{DOUT} \times I_{DAC} \times R_{S-})$. The negative summing voltage $V_{S-}$ is obtained by summing the negative feedback voltage $V_{FB-}$ and the negative loop voltage $V_{L-}$.

As a result, the difference between the summing voltages $V_{S+}$ and $V_{S-}$ can be represented by the following formula according to the above-mentioned description:

$$\begin{aligned}(V_{S+} - V_{S-}) &= (V_{L+} + V_{FB+}) - (V_{L-} + V_{FB-}) = (V_{L+} - I_{FB+} \times R_{S+}) - (V_{L-} + I_{FB-} \times R_{S-}) = (V_{L+} - I_{FB+} \times R) - (V_{L-} + I_{FB-} \times R) \\ &= (V_{L+} - N_{DOUT} \times I_{DAC} \times R) - (V_{L-} + N_{DOUT} \times I_{DAC} \times R) = (V_{L+} - V_{L-}) - 2 \times S_{DOUT} \times I_{DAC} \times R\end{aligned} \quad (2);$$

Comparing formulas (1) with (2), the difference between the summing voltages $V_{S+}$ and $V_{S-}$ remains the same value.

Therefore, the continuous-time delta-sigma ADC 200 can operate with a compact summing circuit 220, saving the consumption of layout area.

Figure 3:
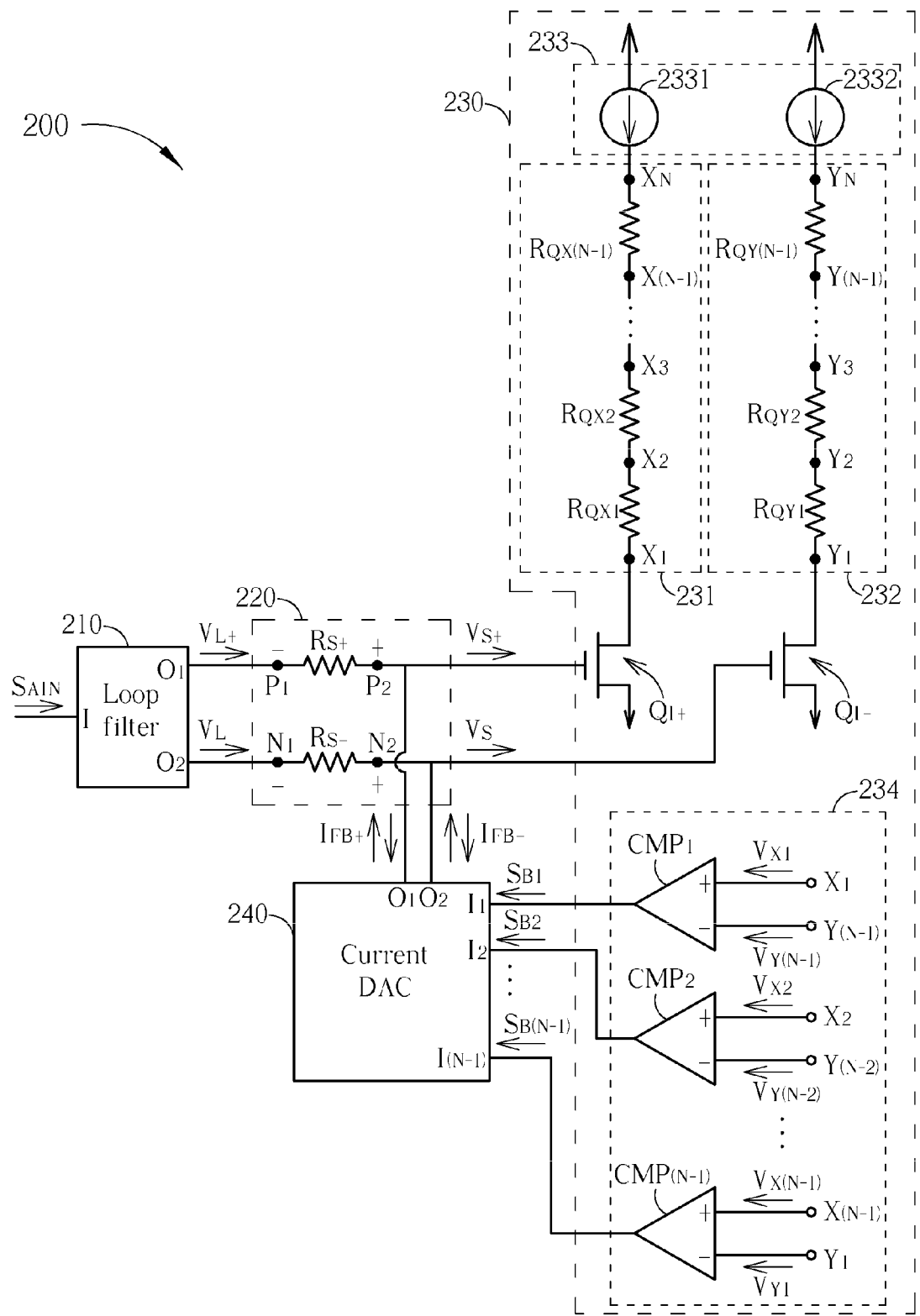
FIG. 3 is a schematic diagram illustrating the quantizer of the present invention.

Please refer to FIG. 3. FIG. 3 is a schematic diagram illustrating the quantizer 230 of the present invention. The quantizer 230 comprises a positive input transistor $Q_{I+}$, a negative input transistor $Q_{I-}$, a positive voltage divider 231, a negative voltage divider 232, a reference current module 233, and a comparing module 234. The reference current module 233 comprises two current sources 2331 and 2332. The current sources 2331 and 2332 respectively provide a reference current $I_{REF}$ to the voltage dividers 231 and 232. The magnitude of the reference current is constant. The voltage dividers 231 and 232 respectively comprise a plurality of positive voltage dividing resistors $R_{QX1} \sim R_{QX(N-1)}$ and a plurality of negative voltage dividing resistors $R_{QY1} \sim R_{QY(N-1)}$, wherein the voltage dividing resistors $R_{QX1} \sim R_{QX(N-1)}$ and $R_{QY1} \sim R_{QY(N-1)}$ all have the same resistance $R_Q$. The resistance $R_Q$ relates to the resistance R, and the relation between the resistance R and the resistance $R_Q$ can be represented by the following formula:

$$R = (N-1) \times R_Q \quad (3);$$

the voltage dividing resistors $R_{QX1} \sim R_{QX(N-1)}$ and $R_{QY1} \sim R_{QY(N-1)}$ are utilized for generating the positive comparing voltages $V_{X1} \sim V_{XN}$ on the nodes $X_1 \sim X_N$ and the negative comparing voltages $V_{Y1} \sim V_{YN}$ on the nodes $Y_1 \sim Y_N$, respectively. The comparing voltages $V_{X1} \sim V_{XN}$ and $V_{Y1} \sim V_{YN}$ can be represented by the following formulas:

$$V_{XA} = V_{X1} + I_{REF} \times (A-1) \times R_Q \quad (4)$$

$$V_{YB} = V_{Y1} + I_{REF} \times (B-1) \times R_Q \quad (5)$$

wherein $1 \leq A \leq N$, $1 \leq B \leq N$, A, B, and N represent positive integers, $V_{XA}$ and $V_{YB}$ represent the $A^{th}$ positive comparing voltage (the voltage on the node $X_A$ of the positive voltage divider 231) and the $B^{th}$ negative comparing voltage (the voltage on the node $Y_B$ of the voltage divider 232) respectively. The first ends of the input transistors $Q_{I+}$ and $Q_{I-}$ are coupled to the voltage divider 231 and 232, respectively; the control ends of the input transistors $Q_{I+}$ and $Q_{I-}$ are coupled to the positive summing resistor $R_{S+}$ (the node $P_2$) and the negative summing resistor $R_{S-}$ (the node $N_2$) of the summing circuit 220. The input transistors $Q_{I+}$ and $Q_{I-}$ output the $1^{st}$ positive comparing voltage $V_{X1}$ and the $1^{st}$ negative comparing voltage $V_{Y1}$ by the first ends of the input transistors $Q_{I+}$ and $Q_{I-}$ to the voltage dividers 231 and 232 as the bias voltages of the voltage dividers 231 and 232, respectively. The voltage drop (the positive transforming voltage) $V_{T+}$ between the first end and the control end of the positive input transistor $Q_{I+}$ and the voltage drop (the negative transforming voltage) $V_{T-}$ between the first end and the control end of the negative input transistor $Q_{I-}$ are fixed because the magnitudes of the reference currents passing through the transistors $Q_{I+}$ and $Q_{I-}$ are the same. Since the voltage level of the $1^{st}$ positive comparing voltage $V_{X1}$ equals $(V_{S+} + V_{T+})$ and the voltage level of the $1^{st}$ negative comparing voltage $V_{Y1}$ equals $(V_{S-} + V_{T-})$, the transforming voltages $V_{T+}$ and $V_{T-}$ are designed to be equal so that $(V_{X1} - V_{Y1})$ equals to $(V_{S+} - V_{S-})$.

The comparing module 234 comprises a plurality of comparators $CMP_1 \sim CMP_{(N-1)}$. The comparators $CMP_1 \sim CMP_{(N-1)}$ compare the comparing voltages $V_{X1} \sim V_{XN}$ and $V_{Y1} \sim V_{YN}$ for generating the compared result signals $S_{B1} \sim S_{B(N-1)}$, respectively. For example, when the positive comparing voltage $V_{X1}$ is higher than the negative comparing voltage $V_{Y(N-1)}$, the comparator $CMP_1$ outputs the compared result signal $S_{B1}$ with logic 1; when the positive comparing voltage $V_{X1}$ is lower than the negative comparing voltage $V_{Y(N-1)}$, the comparator $CMP_1$ outputs the compared result signal $S_{B1}$ with logic 0. When the positive comparing voltage $V_{X2}$ is higher than the negative comparing voltage $V_{Y(N-2)}$, the comparator $CMP_2$ outputs the compared result signal $S_{B2}$ with logic 1; when the positive comparing voltage $V_{X2}$ is lower than the negative comparing voltage $V_{Y(N-2)}$, the comparator $CMP_2$ outputs the compared result signal $S_{B2}$ with logic 0. The rest comparators $CMP_3 \sim CMP_{(N-1)}$ operate in the similar way. By combining the compared result signals $S_{B1} \sim S_{B(N-1)}$, the digital output signal $S_{DOUT}$ is obtained. For example, assuming $S_{DOUT}$ is a 3-bit signal and the value $N_{DOUT}$ represented by the digital output signal $S_{DOUT}$ by means of 1's complement method is between −3 and 3. The compared result signal $S_{B1}$ represents the Most Significant Bit (MSB), and the compared result signal $S_{B(N-1)}$ represents the LSB. In this way, the digital output signal $S_{DOUT}$ can be represented by $[S_{B1}, S_{B2}, S_{B3}]$. When the digital output signal $S_{DOUT}$ is [1,0,0], the value $N_{DOUT}$ is −3. When the digital output signal $S_{DOUT}$ is [0,1,1], the value $N_{DOUT}$ is 3 and so on. Therefore, an $A^{th}$ compared result signal $S_{BA}$ is determined by the difference between the $A^{th}$ positive comparing voltage $V_{XA}$ and the $(N-A)^{th}$ negative comparing voltage $V_{Y(N-A)}$ and the difference between the comparing voltages $V_{XA}$ and $V_{Y(N-A)}$ can be represented by the following formula according to the formulas (3), (4), and (5):

$$\begin{aligned}V_{XA} - V_{Y(N-A)} &= [V_{X1} + I_{REF} \times (A-1) \times R_Q] - [V_{Y1} + I_{REF} \times (N-A-1) \times R_Q] \\ &= (V_{X1} - V_{Y1}) - I_{REF} \times (N-2 \times A) \times R_Q \\ &= (V_{L+} - V_{L-}) - 2 \times N_{DOUT} \times I_{DAC} \times R - I_{REF} \times (N-2-A) \times R_Q \\ &= (V_{L+} - V_{L-}) - 2 \times N_{DOUT} \times I_{DAC} \times (N-1) \times R_Q - I_{REF} \times (N-2-A) \times R_Q\end{aligned} \quad (6);$$

wherein $1 \leq A \leq (N-1)$, A represents a positive integer. Since the digital output signal $S_{DOUT}$ is obtained by the compared result signals $S_{B1} \sim S_{B(N-1)}$ and the compared result signals $S_{B1} \sim S_{B(N-1)}$ can be determined by the formula (6), the digital output signal $S_{DOUT}$ can be obtained by the formula (6).

Figure 4:
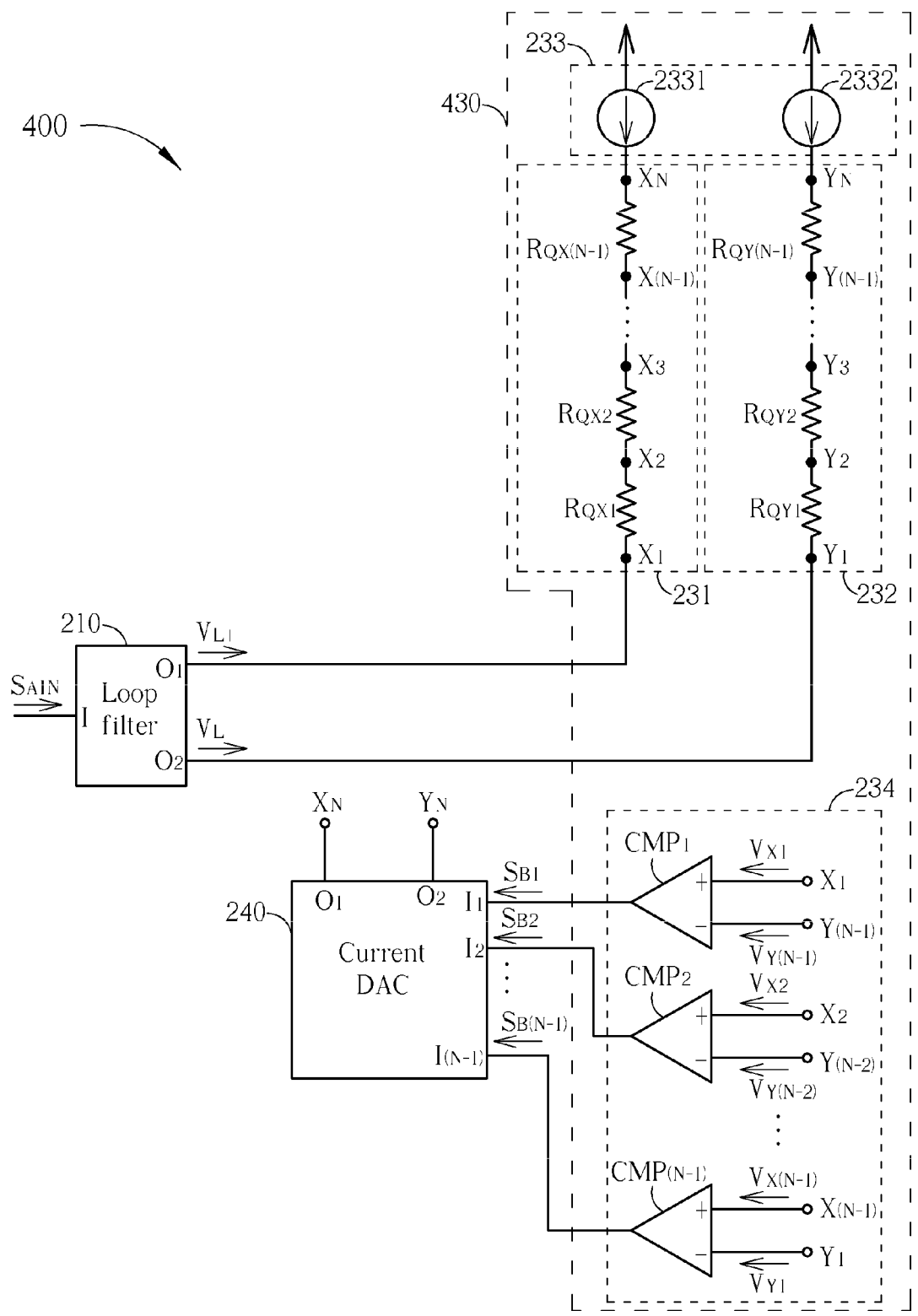
FIG. 4 is a diagram illustrating a continuous-time delta-sigma ADC according to a second embodiment of the present invention.

Please refer to FIG. 4. FIG. 4 is a diagram illustrating a continuous-time delta-sigma ADC 400 according to a second embodiment of the present invention. The continuous-time delta-sigma ADC 400 comprises a loop filter 210, a current DAC 240, and a quantizer 430. The functions of loop filter 210 and the current DAC 240 are described as above-mentioned and will not be repeated again for brevity. It is noticeable that the quantizer 430 is integrated with summing function so that the summing circuit is no longer required. Compared to the quantizer 230, the quantizer 430 does not comprise the input transistors $Q_{I+}$ and $Q_{I-}$. In other words, in the continuous-time delta-sigma ADC 200, the output ends $O_1$ and $O_2$ of the loop filter 210 are coupled to the control ends of the input transistors $Q_{I+}$ and $Q_{I-}$, respectively. However, in the continuous-time delta-sigma ADC 400, the output ends $O_1$ and $O_2$ of the loop filter 210 are, instead, coupled to the voltage dividers 231 and 232, respectively. Hence, in the continuous-time delta-sigma ADC 400, the comparing voltages $V_{X1}$ and $V_{Y1}$ equal to the loop voltages $V_{L+}$ and $V_{L-}$, respectively. In addition, in the continuous-time delta-sigma ADC 200, the output ends $O_1$ and $O_2$ of the current DAC 240 are coupled to the control ends of the input transistors $Q_{I+}$ and $Q_{I-}$, respectively. However, in the continuous-time delta-sigma ADC 400, the output end $O_1$ of the current DAC 240 are coupled to the current source 2331 and the node $X_N$ of the voltage divider 231, and the output end $O_2$ of the current DAC 240 are coupled to the current source 2332 and the node $Y_N$ of the voltage divider 232. In this way, the difference between the $A^{th}$ positive comparing voltage $V_{XA}$ and the $(N-A)^{th}$ negative comparing voltage $V_{Y(N-A)}$ can be represented by the following formula:

$$V_{XA}-V_{Y(N-A)}=[V_{X1}-N_{DOUT}\times I_{DAC}\times (N-1)\times R_Q+I_{REF}\times (A-1)\times R_Q]-[V_{Y1}+N_{DOUT}\times I_{DAC}\times (N-1)\times R_Q+I_{REF}\times (N-A-1)\times R_Q]=(V_{L+}-V_{L-})-2\times N_{DOUT}\times I_{DAC}\times (N-1)\times R_Q-I_{REF}\times (N-2\times A)\times R_Q \quad (7);$$

by comparing formulas (6) and (7), it can be derived that the compared result signal $S_{BA}$ determined by the difference between the comparing voltage $V_{XA}$ and the comparing voltage $V_{Y(N-A)}$ remains the same value. That is, the continuous-time delta-sigma ADC 400 is equivalent to the continuous-time delta-sigma ADC 200. In addition, since no summing circuit exists between the quantizer 430 and the loop filter 210, the delay from the output of the loop filter 210 to the quantizer 430 is reduced so that the system stability of the continuous-time delta-sigma ADC 400 is improved.

Figure 5:
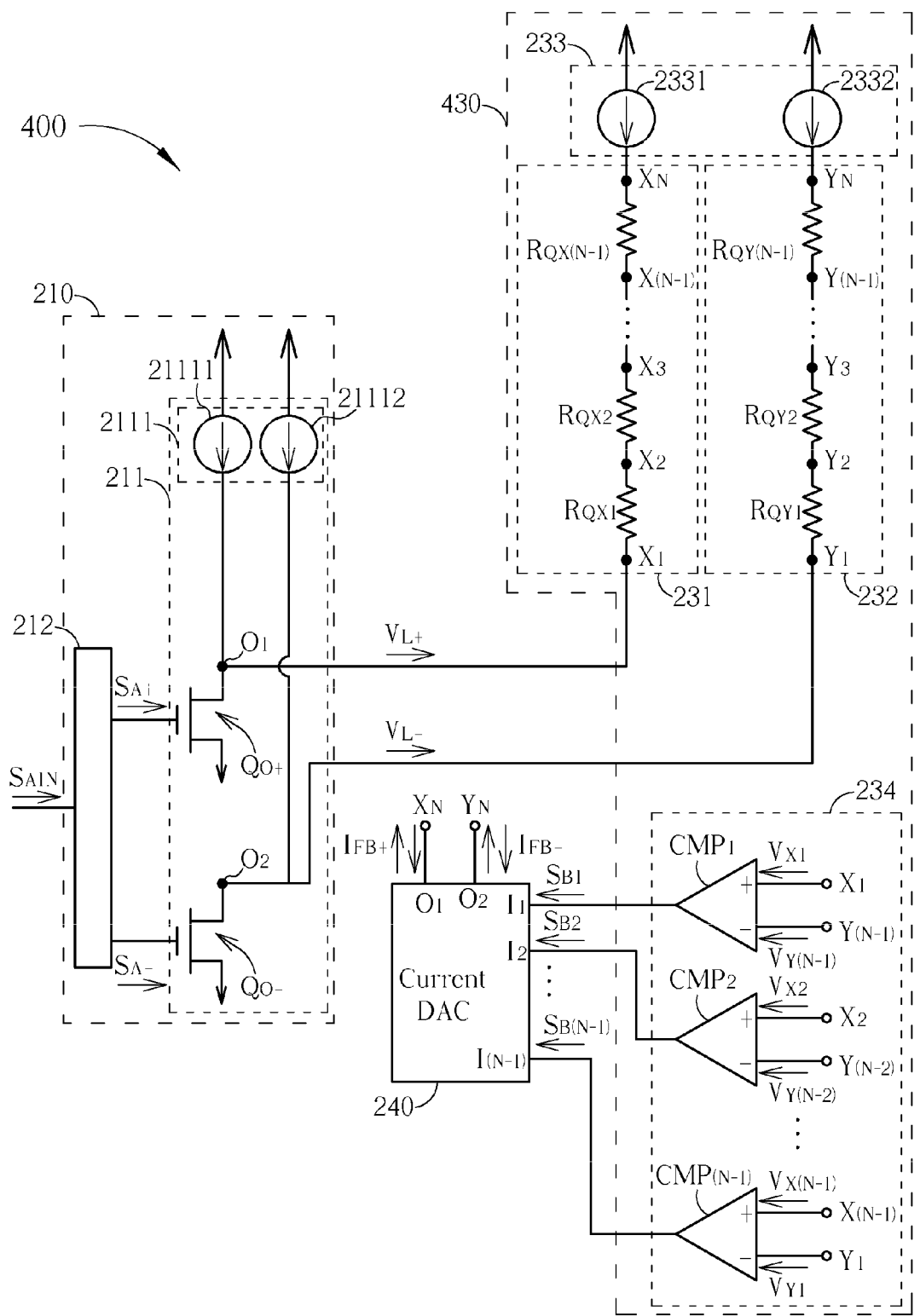
FIG. 5 is a diagram illustrating the loop filter of the continuous-time delta-sigma ADC.

Please refer to FIG. 5. FIG. 5 is a diagram illustrating the loop filter 210 of the continuous-time delta-sigma ADC 400. The loop filter 210 comprises an output stage 211 and a delta-sigma modulator 212. The delta-sigma modulator 212 receives and noise-shapes the analog input signal $S_{AIN}$, and accordingly generates a positive analog signal $S_{A+}$ and a negative analog signal $S_{A-}$. The output stage 211 comprises a reference current module 2111, a positive output transistor $Q_{O+}$, and a negative output transistor $Q_{O-}$. The reference current module 2111 comprises two current sources 21111 and 21112. The current sources 21111 and 21112 provide enough currents to output transistors $Q_{O+}$ and $Q_{O-}$, so that the output transistors $Q_{O+}$ and $Q_{O-}$ can operate in the saturation region and can be utilized as source followers. The control end of the positive output transistor $Q_{O+}$ receives the positive analog signal $S_{A+}$; the first end (source) of the positive output transistor $Q_{O+}$ outputs the positive loop voltage $V_{L+}$ according to the positive analog signal $S_{A+}$. The control end of the negative output transistor $Q_{O-}$ receives the negative analog signal $S_{A-}$; the first end (source) of the negative output transistor $Q_{O-}$ outputs the negative loop voltage $V_{L-}$ according to the negative analog signal $S_{A-}$. The node $O_1$ between the current source 21111 and the positive output transistor $Q_{O+}$, and the node $O_2$ between the current source 21112 and the negative output transistor $Q_{O-}$ are the output ends of the loop filter 210 for outputting the loop voltages $V_{L+}$ and $V_{L-}$.

Figure 6:
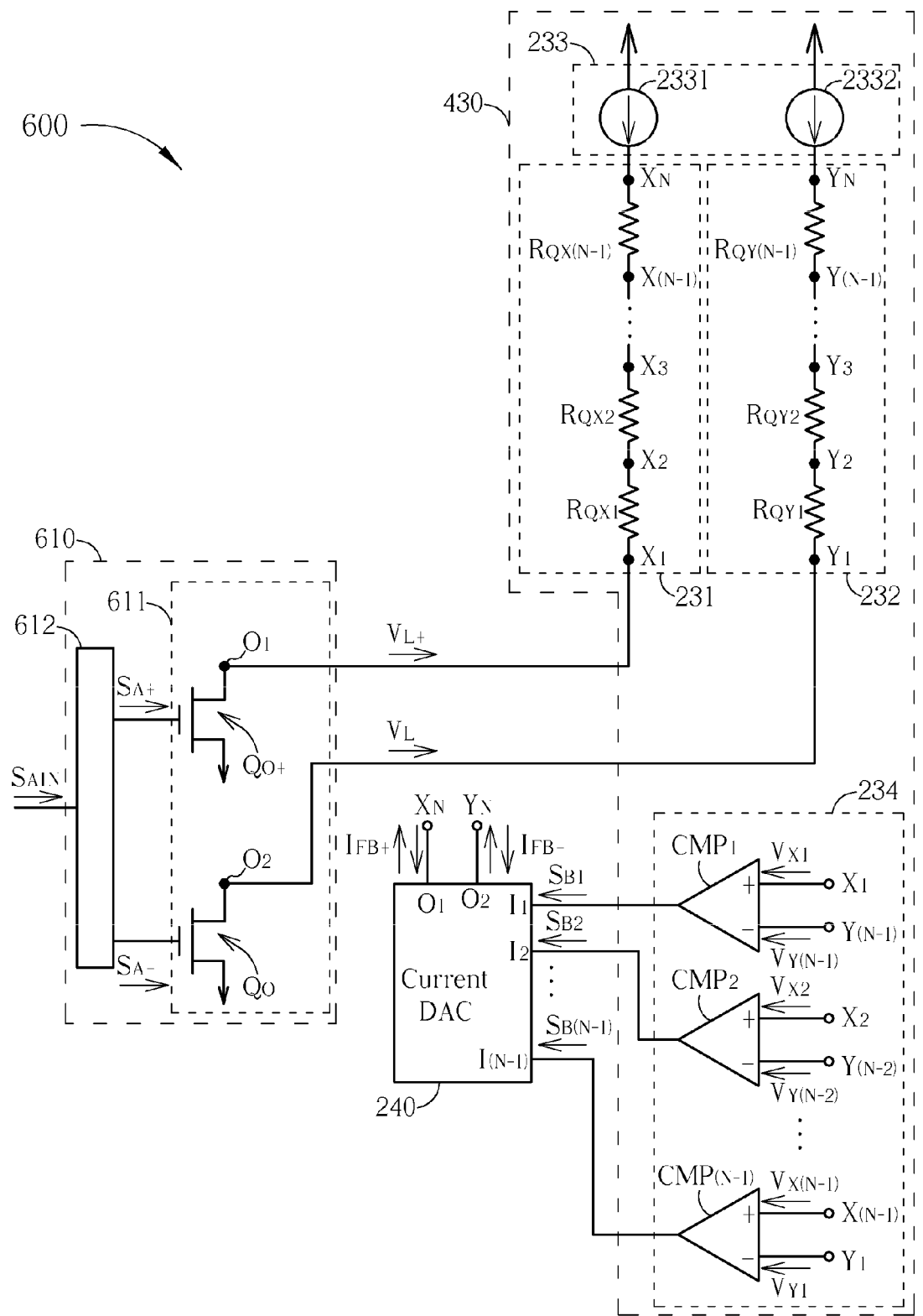
FIG. 6 is a diagram illustrating a continuous-time delta-sigma ADC according to a third embodiment of the present invention.

Please refer to FIG. 6. FIG. 6 is a diagram illustrating a continuous-time delta-sigma ADC 600 according to a third embodiment of the present invention. The structure and operational principles of the continuous-time delta-sigma ADC 600 are similar to those of the continuous-time delta-sigma ADC 400. The difference is that, in the continuous-time delta-sigma ADC 600, the output stage 611 of the loop filter 610 does not comprise the reference current module 2111. The first ends of the output transistors $Q_{O+}$ and $Q_{O-}$ are coupled to the current sources 2331 and 2332 through the voltage dividers 231 (the node $X_1$) and 232 (the node $Y_1$), respectively. Since the currents provided by the current sources 2331 and 2332 are enough for the output transistors $Q_{O+}$ and $Q_{O-}$ operating in the saturation region, the current sources 21111 and 21112 from FIG. 5 are not required in the output stage 611 of the loop filter 610. The output transistors $Q_{O+}$ and $Q_{O-}$ can operate as source followers for outputting the loop voltages $V_{L+}$ and $V_{L-}$ so that the continuous-time delta-sigma ADC 600 is equivalent to the continuous-time delta-sigma ADC 400 and the current consumption is reduced because the current sources 21111 and 21112 are saved.

Figure 7:
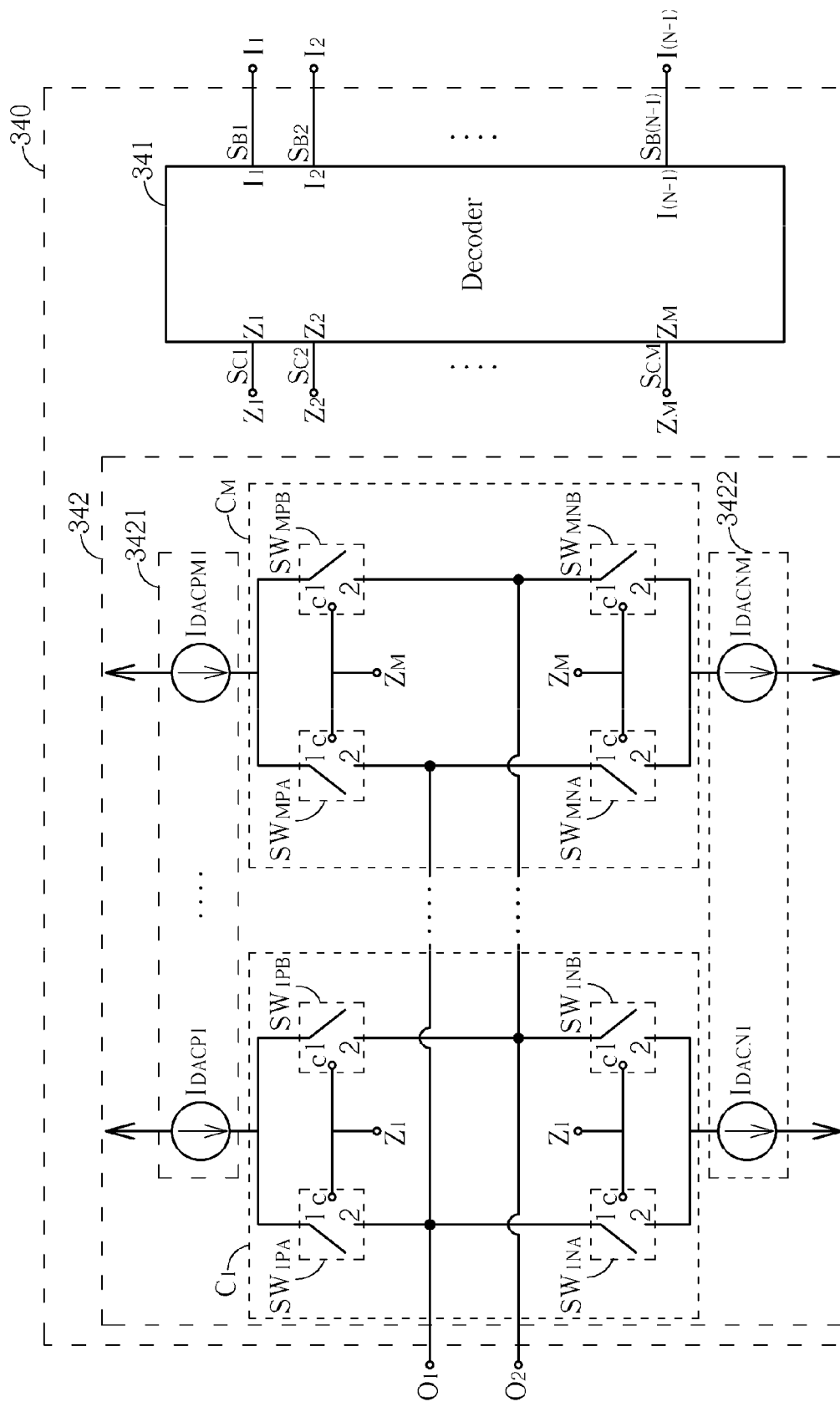
FIG. 7 is a diagram illustrating a current DAC according to a first embodiment of the current DAC.

Please refer to FIG. 7. FIG. 7 is a diagram illustrating a current DAC 340 according to a first embodiment of the current DAC 240. The current DAC 340 comprises a decoder 341 and a cell circuit 342. The decoder 341 receives the digital output signal $S_{DOUT}$ (the compared result signals $S_{B1}$~$S_{B(N-1)}$) from the input ends $I_1$~$I_{(N-1)}$ of the decoder 341. The decoder 341 outputs the switch control signals $S_{C1}$~$S_{CM}$ according to the digital output signal $S_{DOUT}$. The cell circuit 342 generates the feedback current $I_{FB+}$ and $I_{FB-}$ according to the switch control signals $S_{C1}$~$S_{CM}$. The cell circuit 342 comprises a souring current module 3421, a draining current module 3422, and a plurality of cells $C_1$~$C_M$. The sourcing current module 3421 comprises a plurality of sourcing current source $I_{DACP1}$~$I_{DACPM}$. The draining current module 3422 comprises a plurality of draining current source $I_{DACN1}$~$I_{DACNM}$. The sourcing current sources $I_{DACP1}$~$I_{DACPM}$ and the draining current source $I_{DACN1}$~$I_{DACNM}$ provide currents with the same magnitude $I_{DAC}$. Each cell of the plurality of the cells $C_1$~$C_M$ comprises four switches. For example, the cell $C_1$ comprises four switches $SW_{1PA}$, $SW_{1PB}$, $SW_{1NA}$, and $SW_{1NB}$. The control ends C of the switches $SW_{1PA}$, $SW_{1PB}$, $SW_{1NA}$, and $SW_{1NB}$ are coupled to the output end $Z_1$ of the decoder for receiving the switch control signal $S_{C1}$; the first ends 1 of the switches $SW_{1PA}$, $SW_{1PB}$, $SW_{1NA}$, and $SW_{1NB}$ are coupled to the second ends 2 of the switches $SW_{1PA}$, $SW_{1PB}$, $SW_{1NA}$, and $SW_{1NB}$ according to the switch control signal $S_{C1}$. More particularly, when the switch control signal $S_{C1}$ indicates "draining", the switches $SW_{1NA}$ and $SW_{1PB}$ couple their first ends 1 to their second ends 2, but the switches $SW_{1NB}$ and $SW_{1PA}$ do not couple their first ends 1 to their second ends 2. In this way, the draining current source $I_{DACN1}$ drains a current with a magnitude $I_{DAC}$ through the cell $C_1$ from the output end $O_1$ of the current DAC 340, and the sourcing current source $I_{DACP1}$ sources a current with a magnitude $I_{DAC}$ through the cell $C_1$ to the output end $O_2$ of the current DAC 340. When the switch control signal $S_{C1}$ indicates "sourcing", the switches $SW_{1NB}$ and $SW_{1PA}$ couple their first ends 1 to their second ends 2, but the switches $SW_{1NA}$ and $SW_{1PB}$ do not couple their first ends 1 to their second ends 2. In this way, the draining current source $I_{DACN1}$ drains a current with a magnitude $I_{DAC}$ through the cell $C_1$ from the output end $O_2$ of the current DAC 340, and the sourcing current source $I_{DACP1}$ sources a current with a magnitude $I_{DAC}$ through the cell $C_1$ to the output end $O_1$ of the current DAC 340. The structures and operation principles of the rest cells $C_2$~$C_M$ are similar to the cell $C_1$ and are not repeated again for brevity. By means of the decoder 341 transforming the digital output signal $S_{DOUT}$ to be the switch control signals $S_{C1}$~$S_{CM}$, and the current modules 3421 and 3422 draining/sourcing currents through the cells $C_1$~$C_M$ according to the switch control signals $S_{C1}$~$S_{CM}$, the current DAC 340 generates the feedback currents $I_{FB+}$ and $I_{FB-}$ according to the digital output signal $S_{DOUT}$.

Figure 8:
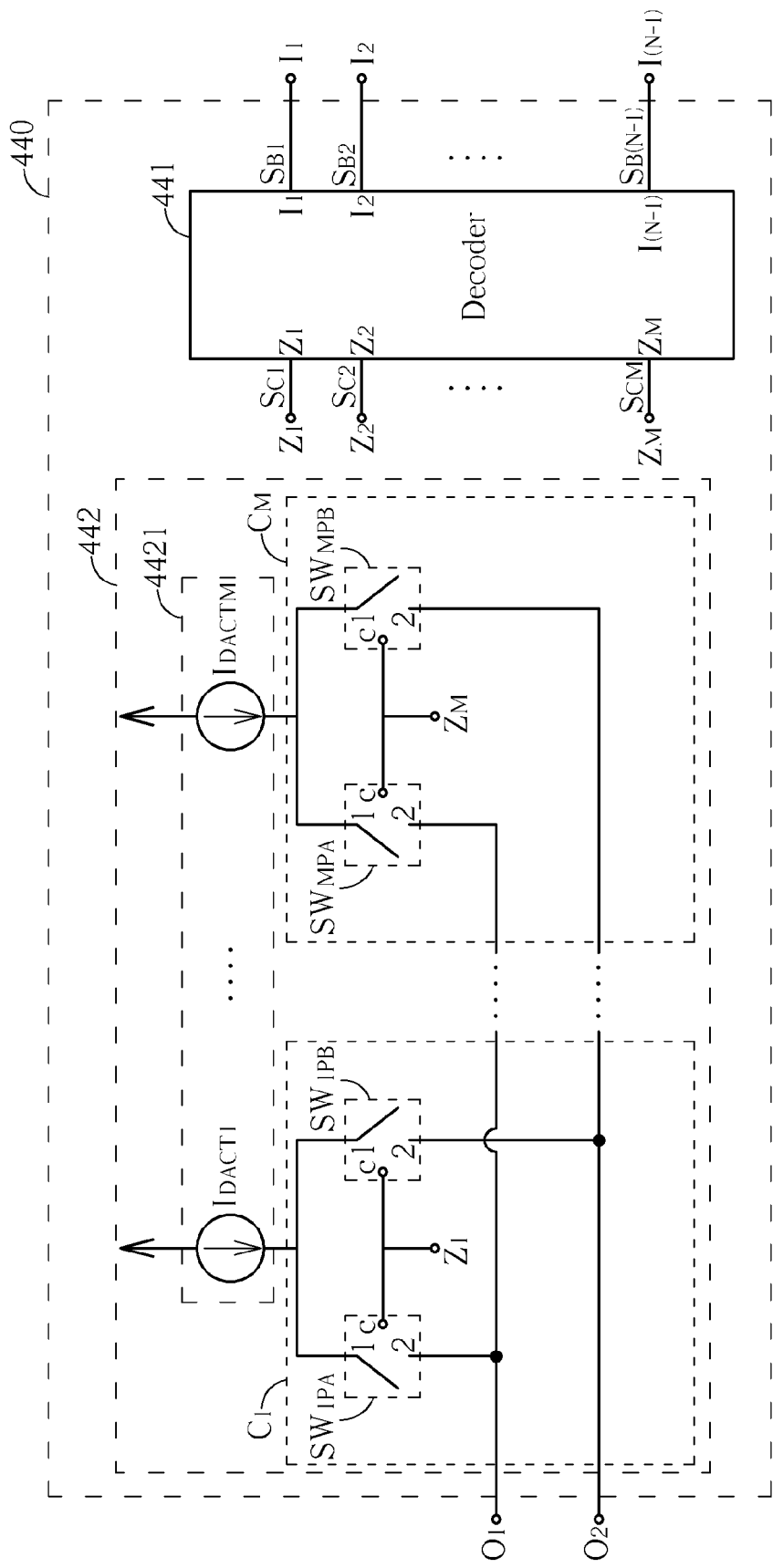
FIG. 8 is a diagram illustrating a current DAC according to a second embodiment of the current DAC.

Please refer to FIG. 8. FIG. 8 is a diagram illustrating a current DAC 440 according to a second embodiment of the current DAC 240. The current DAC 440 comprises a decoder 441 and a cell circuit 442. The structure and the operational principle of the decoder 441 are similar to the decoder 341 and are not repeated again for brevity. Comparing the cell circuits 442 with 342, each cell $C_1$~$C_M$ of the cell circuit 442 comprises only two switches, and the cell circuit 442 comprises only a sourcing current module 4421. For example, the cell $C_1$ comprises two switches $SW_{1PA}$ and $SW_{1PB}$. The sourcing current source $I_{DACT1}$ provides a cell current $I_{DACT1}$. It is noticeable that the magnitudes of the cell currents $I_{DACT1}$~$I_{DACTM}$ all equal to $I_{DAC2}$, and the magnitude $I_{DAC2}$ is different from the above-mentioned magnitude $I_{DAC}$. In this way, the magnitude of the currents provided by the current sources 2331 and 2332 of the quantizers 230 and 430 are adjusted according to the magnitude $I_{DAC2}$ so as to keep the digital output signal $S_{DOUT}$ correctly outputted. The switches $SW_{1PA}$, $SW_{1PB}$ couple their first ends 1 to their second ends 2 according to the switch control signal $S_{C1}$. For example, when the switch control signal $S_{C1}$ indicates "draining", the first end 1 of the switch $SW_{1PB}$ is coupled to the second end 2 of the switch $SW_{1PB}$, but the first end 1 of the switch $SW_{1PA}$ is not coupled to the second end 2 of the switch $SW_{1PA}$. In this way, the sourcing current source $I_{DACT1}$ sources a current with a magnitude $I_{DAC2}$ through the cell $C_1$ from the output end $O_2$ of the current DAC 440. When the switch control signal $S_{C1}$ indicates "sourcing", the first end 1 of the switch $SW_{1PA}$ is coupled to the second end 2 of the switch $SW_{1PA}$, but the first end 1 of the switch $SW_{1PB}$ is not coupled to the second end 2 of the switch $SW_{1PB}$. In this way, the sourcing current source $I_{DACT1}$ sources a current with a magnitude $I_{DAC2}$ through the cell $C_1$ to the output end $O_1$ of the current DAC 440. The structures and operation principles of the rest cells $C_2 \sim C_M$ are similar to the cell $C_1$ and are not repeated again for brevity. By means of the decoder 441 transforming the digital output signal $S_{DOUT}$ to be the switch control signals $S_{C1} \sim S_{CM}$, and the cells $C_1 \sim C_M$ draining/sourcing currents according to the switch control signals $S_{C1} \sim S_{CM}$, the current DAC 440 generates the feedback currents $I_{FB+}$ and $I_{FB-}$ according to the digital output signal $S_{DOUT}$.

In conclusion, the present invention provides a continuous-time delta-sigma ADC with a compact summing circuit. In addition, the present invention further integrates the summing function into the quantizer, reduces the current sources of the output stage of the loop filter, and reduces the current sources and switches in the current DAC. In this way, the structure of the continuous-time delta-sigma ADC becomes compact, saving the layout area and the current consumption, and improving the system stability.

Those skilled in the art will readily observe that numerous modifications and alterations of the device and method may be made while retaining the teachings of the invention.

What is claimed is:

1. A continuous-time delta-sigma Analog to Digital Converter (ADC) with a compact structure, comprising:
    a loop filter, comprising:
        a delta-sigma modulator, for receiving and noise-shaping an analog input signal and accordingly generating a first and a second analog signals; and
        an output stage, for outputting a first and a second loop voltages, comprising:
            a first output transistor, comprising:
                a control end, for receiving the first analog signal;
                a first end, for receiving a first reference current; and
                a second end;
                wherein the positive output transistor outputs the first loop voltage at the first end of the first output transistor according to the first analog signal and the first reference current; and
            a second output transistor, comprising:
                a control end, for receiving the second analog signal;
                a first end, for receiving the first reference current; and
                a second end;
                wherein the second output transistor outputs the second loop voltage at the first end of the second output transistor according to the second analog signal and the first reference current;
    a quantizer, for outputting a digital output signal according to the difference between the first loop voltage and the second loop voltage, the quantizer comprising:
        a first reference current module, for providing the first reference current;
        a first voltage divider, coupled between the first end of the first output transistor and the first reference current module, for receiving the first reference current, the first voltage divider comprising $(N_1-1)$ positive voltage dividing resistors for generating $N_1$ positive comparing voltages according to the first reference current, and an $A^{th}$ positive comparing voltage can be represented by a following formula:

$V_{CA+} = V_{C1+} + I_{REF} \times (A-1) \times R_Q;$ a second voltage divider, coupled between the first end of the second output transistor and the first reference current module, for receiving the first reference current, the second voltage divider comprising $(N_1-1)$ second voltage dividing resistors for generating $N_1$ second comparing voltages according to the first reference current, a $B^{th}$ second comparing voltage can be represented by a following formula:

$V_{CB-} = V_{C1-} + I_{REF} \times (B-1) \times R_Q;$ wherein $N_1$, A, and B represents positive integers, $1 \leq A \leq N_1$, $1 \leq B \leq N_1$, $V_{CA+}$ represents the $A^{th}$ first comparing voltage, $V_{CB-}$ represents the $B^{th}$ second comparing voltage, $V_{C1+}$ represents a first first comparing voltage, $V_{C1-}$ represents a first second comparing voltage, $I_{REF}$ represents magnitude of the first reference current, and $R_Q$ represents resistance of one of the $(N_1-1)$ first or the $(N_1-1)$ second voltage dividing resistors;
            wherein resistance of the $(N_1-1)$ first voltage dividing resistors and the $(N_1-1)$ second voltage dividing resistors are same; and
        a comparing module, comprising $(N_1-1)$ comparators for generating $(N_1-1)$ compared result signals;
            wherein an $M^{th}$ comparator of the $(N_1-1)$ comparators compares an $M^{th}$ first comparing voltage of the $(N_1-1)$ first comparing voltages and an $(N_1-M)^{th}$ second comparing voltage of the $(N_1-1)$ second comparing voltages for generating an $M^{th}$ compared result signal and $1 \leq M \leq (N_1-1)$;
            wherein the digital output signal is obtained by combining the $(N_1-1)$ compared result signals; and
        a current DAC, coupled to the first voltage divider, the second voltage divider, and the first reference current module, for generating the first and the second feedback currents according to the digital output signal.

2. The continuous-time delta-sigma ADC of claim 1, wherein the current DAC comprises:
    a decoder, for outputting $N_2$ switch control signals according to the digital output signal, $N_2$ representing a positive integer; and
    a cell circuit, for generating the first and the second feedback currents according to the $N_2$ switch control signals.

3. The continuous-time delta-sigma ADC of claim 1, wherein the loop filter further comprises:
    a second reference current module, for providing a second reference current to the first output transistor and the second output transistor.

4. A continuous-time delta-sigma Analog to Digital Converter (ADC) with a compact structure, comprising:
- a loop filter, for receiving and noise-shaping an analog input signal, and accordingly outputting a first loop voltage and a second loop voltage;
- a summing circuit, comprising:
  - a first summing resistor, for transforming a first feedback current to be a first feedback voltage, and summing the first loop voltage and the first feedback voltage so as to generate a first summing voltage, wherein the first summing voltage is equal to a sum of the first loop voltage and the first feedback voltage; and
- a quantizer, for outputting a digital output signal according to a difference between the first summing voltage and the second loop voltage; and
- a current Digital to Analog Converter (DAC), for generating the first feedback current according to the digital output signal.

5. The continuous-time delta-sigma ADC of claim 4, wherein the current DAC generates a second feedback current according to the digital output signal;
wherein the summing circuit further comprises:
- a second summing resistor for transforming the second feedback current to be a second feedback voltage, and summing the second loop voltage and the second feedback voltage so as to generate a second summing voltage;
wherein the quantizer outputs the digital output signal according to a difference between the first summing voltage and the second summing voltage.

6. The continuous-time delta-sigma ADC of claim 5, wherein the first summing resistor and the second summing resistor have same resistance.

7. The continuous-time delta-sigma ADC of claim 6, wherein the difference between the first summing voltage and the second summing voltage can be represented by a following formula:

$$(V_{S+} - V_{S-}) = (V_{L+} - I_{FB+} \times R) - (V_{L-} + I_{FB-} \times R);$$

wherein $V_{S+}$ represents the first summing voltage, $V_{S-}$ represents the second summing voltage, $V_{L+}$ represents the first loop voltage, $V_{L-}$ represents the second loop voltage, $I_{FB+}$ represents magnitude of the first feedback current, $I_{FB-}$ represents magnitude of the second feedback current, and R represents resistance of one of the first or the second summing resistors.

8. The continuous-time delta-sigma ADC of claim 7, wherein magnitude of the first or the second feedback current can be represented by a following formula:

$$I_{FB} = N_{DOUT} \times I_{DAC};$$

wherein $I_{FB}$ represents the magnitudes the first or the second feedback current, $N_{DOUT}$ represents a value represented by the digital output signal, $I_{DAC}$ represent magnitude of a Least Significant Bit (LSB) current of the current DAC.

9. The continuous-time delta-sigma ADC of claim 8, wherein when the value represented by the digital output signal is larger than a predetermined value, the current DAC sources the first and the second feedback currents to the summing circuit; when the value represented by the digital output signal is smaller than the predetermined value, the current DAC drains the first and the second feedback currents to the summing circuit.

10. The continuous-time delta-sigma ADC of claim 5, wherein the first feedback voltage is generated by the first feedback current passing through the first summing resistor; the second feedback voltage is generated by the second feedback current passing through the second summing resistor.

11. The continuous-time delta-sigma ADC of claim 5, wherein the current DAC comprises:
- a decoder, for outputting $N_2$ switch control signals according to the digital output signal; and
- a cell circuit, for generating the first and the second feedback currents according to the $N_2$ switch control signals;
wherein $N_2$ represents a positive integer.

12. The continuous-time delta-sigma ADC of claim 11, wherein the cell circuit comprises:
- a sourcing current module, for sourcing a predetermined current;
- $N_2$ cells, wherein a $K^{th}$ cell comprises:
  - a first switch, comprising:
    - a first end, coupled to the sourcing current module;
    - a second end, coupled to the first summing resistor and the quantizer; and
    - a control end, coupled to the decoder for receiving a $K^{th}$ switch signal of the $N_2$ switch control signals;
    - wherein when the $K^{th}$ switch control signal indicates sourcing, the first switch couples the first end of the first switch to the second end of the first switch;
    - wherein when the $K^{th}$ switch control signal indicates draining, the first switch does not couple the first end of the first switch to the second end of the first switch; and
  - a second switch, comprising:
  - a first end, coupled to the sourcing current module;
  - a second end, coupled to the negative summing resistor and the quantizer; and
  - a control end, coupled to the decoder for receiving a $K^{th}$ switch signal of the $N_2$ switch control signals;
    - wherein when the $K^{th}$ switch control signal indicates draining, the second switch couples the first end of the second switch to the second end of the second switch;
    - wherein when the $K^{th}$ switch control signal indicates sourcing, the second switch does not couple the first end of the second switch to the second end of the second switch;
wherein K represents a positive integer, and $1 \leq K \leq N_2$.

13. A summing circuit of saving layout area of a continuous-time delta-sigma Analog to Digital Converter (ADC), the continuous-time delta-sigma ADC having a loop filter, a quantizer, and a current Digital to Analog Converter (DAC), the loop filter receiving and noise-shaping an analog input signal, and accordingly outputting a first loop voltage and a second loop voltage, the quantizer outputting a digital output signal according to a difference between a first summing voltage and the second loop voltage, the current DAC generating a first feedback current according to the digital output signal, the summing circuit comprising:
- a first summing resistor, for transforming the first feedback current to be a first feedback voltage, and summing the first loop voltage and the first feedback voltage so as to generate the first summing voltage;
wherein the first summing voltage is equal to a sum of the first loop voltage and the first feedback voltage.

14. The summing circuit of claim 13, wherein the current DAC generates a second feedback current according to the digital output signal;
wherein the summing circuit further comprises:
- a second summing resistor for transforming the second feedback current to be a second feedback voltage, and summing the second loop voltage and the second feedback voltage so as to generate a second summing voltage;

wherein the quantizer outputs the digital output signal according to a difference between the first summing voltage and the second summing voltage.

15. The summing circuit of claim 14, wherein the first summing resistor and the second summing resistor have same resistance.

16. The summing circuit of claim 15, wherein the difference between the first summing voltage and the second summing voltage can be represented by a following formula:

$$(V_{S+} - V_{S-}) = (V_{L+} - I_{FB+} \times R) - (V_{L-} + I_{FB-} \times R);$$

wherein $V_{S+}$ represents the first summing voltage, $V_{S-}$ represents the second summing voltage, $V_{L+}$ represents the first loop voltage, $V_{L-}$ represents the second loop voltage, $I_{FB+}$ represents magnitude of the first feedback current, $I_{FB-}$ represents magnitude of the second feedback current, and R represents resistance of one of the first or the second summing resistors.

17. The summing circuit of claim 16, wherein magnitude of the first or the second feedback current can be represented by a following formula:

$$I_{FB} = N_{DOUT} \times I_{DAC};$$

wherein $I_{FB}$ represents the magnitudes the first or the second feedback current, $N_{DOUT}$ represents a value represented by the digital output signal, $I_{DAC}$ represent magnitude of a Least Significant Bit (LSB) current of the current DAC.

18. The summing circuit of claim 17, wherein when the value represented by the digital output signal is larger than a predetermined value, the current DAC sources the first and the second feedback currents to the summing circuit; when the value represented by the digital output signal is smaller than the predetermined value, the current DAC drains the first and the second feedback currents to the summing circuit.

19. The summing circuit of claim 14, wherein the first feedback voltage is generated by the first feedback current passing through the first summing resistor; the second feedback voltage is generated by the second feedback current passing through the second summing resistor.

20. The summing circuit of claim 14, wherein the current DAC comprises:
a decoder, for outputting $N_2$ switch control signals according to the digital output signal; and
a cell circuit, for generating the first and the second feedback currents according to the $N_2$ switch control signals;
wherein $N_2$ represents a positive integer.

21. The continuous-time delta-sigma ADC of claim 20, wherein the cell circuit comprises:
a sourcing current module, for sourcing a predetermined current;
$N_2$ cells, wherein a $K^{th}$ cell comprises:
a first switch, comprising:
a first end, coupled to the sourcing current module;
a second end, coupled to the first summing resistor and the quantizer; and
a control end, coupled to the decoder for receiving a $K^{th}$ switch signal of the $N_2$ switch control signals;
wherein when the $K^{th}$ switch control signal indicates sourcing, the first switch couples the first end of the first switch to the second end of the first switch;
wherein when the $K^{th}$ switch control signal indicates draining, the first switch does not couple the first end of the first switch to the second end of the first switch; and
a second switch, comprising:
a first end, coupled to the sourcing current module;
a second end, coupled to the negative summing resistor and the quantizer; and
a control end, coupled to the decoder for receiving a $K^{th}$ switch signal of the $N_2$ switch control signals;
wherein when the $K^{th}$ switch control signal indicates draining, the second switch couples the first end of the second switch to the second end of the second switch;
wherein when the $K^{th}$ switch control signal indicates sourcing, the second switch does not couple the first end of the second switch to the second end of the second switch;
wherein K represents a positive integer, and $1 \leq K \leq N_2$.

* * * * *